(12) United States Patent
Yu et al.

(10) Patent No.: US 12,231,145 B1
(45) Date of Patent: Feb. 18, 2025

(54) SYSTEMS AND METHODS FOR DIGITAL SIGNAL SYNTHESIS WITH VARIABLE SAMPLE RATE DAC

(71) Applicant: Mixed-Signal Devices Inc., Irvine, CA (US)

(72) Inventors: Tommy Yu, Orange, CA (US); Avanindra Madisetti, Coto de Caza, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 160 days.

(21) Appl. No.: 18/174,093

(22) Filed: Feb. 24, 2023

Related U.S. Application Data

(60) Provisional application No. 63/268,457, filed on Feb. 24, 2022.

(51) Int. Cl.
*H03M 1/82* (2006.01)
*H03M 1/06* (2006.01)
*H04L 27/26* (2006.01)

(52) U.S. Cl.
CPC ......... *H03M 1/822* (2013.01); *H03M 1/0626* (2013.01); *H04L 27/26412* (2021.01)

(58) Field of Classification Search
CPC ................ H03M 1/822; H03M 1/0626; H04L 27/26412
(Continued)

(56) References Cited

U.S. PATENT DOCUMENTS 5,682,161 A   10/1997   Ribner et al.
5,889,443 A    3/1999   Joergensen
(Continued)

FOREIGN PATENT DOCUMENTS

CN   110168930 A    8/2019
EP    3542461 A1    9/2019
(Continued)

OTHER PUBLICATIONS

Extended European Search Report for European Application No. 17872454.8, Search completed May 25, 2020, Mailed Jun. 4, 2020, 15 pgs.
(Continued)

*Primary Examiner* — Khai M Nguyen
(74) *Attorney, Agent, or Firm* — KPPB LLP

(57) ABSTRACT

Systems and methods for digital signal synthesis with variable sample rate digital-to-analog converters (DACs) in accordance with various embodiments of the invention are described. One embodiment includes a digital frequency generator that includes a direct digital frequency synthesizer (DDFS); a digital-to-analog converter (DAC); a frequency/phase estimation circuit; a stable reference clock (REF CLK); a variable frequency sample clock; a frequency control word (FCW); where the DAC is sampled by the variable frequency sample clock; where the DDFS is clocked by the variable frequency sample clock; where the frequency/phase estimation circuit receives as inputs the stable REF CLK and the variable frequency sample clock and estimates a FCW frequency error and adjusts the FCW to the DDFS; where the DDFS receives the FCW and outputs a digital sine codeword at the variable frequency sample clock to the DAC, where the FCW to the DDFS is continuously adjusted to track the variable frequency sample clock.

7 Claims, 14 Drawing Sheets

(58) Field of Classification Search
USPC .................................. 341/143–144, 152
See application file for complete search history.

(56) References Cited

U.S. PATENT DOCUMENTS

| | | | |
|---|---|---|---|
| 5,914,933 | A | 6/1999 | Cimini et al. |
| 6,414,455 | B1 * | 7/2002 | Watson ............... H02P 27/06 |
| | | | 417/18 |
| 6,724,249 | B1 | 4/2004 | Nilsson |
| 7,176,820 | B1 | 2/2007 | Fuller et al. |
| 8,294,605 | B1 | 10/2012 | Pagnanelli |
| 8,949,699 | B1 | 2/2015 | Gustlin |
| 10,020,818 | B1 | 7/2018 | Yu et al. |
| 10,090,845 | B1 * | 10/2018 | Midha ............... H03L 7/081 |
| 10,367,522 | B2 | 7/2019 | Yu et al. |
| 10,530,372 | B1 | 1/2020 | Yu et al. |
| 10,812,087 | B2 | 10/2020 | Yu et al. |
| 10,840,939 | B2 | 11/2020 | Yu et al. |
| 11,258,448 | B2 | 2/2022 | Yu et al. |
| 11,933,919 | B2 | 3/2024 | Yu et al. |
| 2001/0022555 | A1 | 9/2001 | Lee et al. |
| 2002/0053986 | A1 | 5/2002 | Brooks et al. |
| 2002/0057214 | A1 | 5/2002 | Brooks et al. |
| 2002/0061086 | A1 | 5/2002 | Adachi et al. |
| 2002/0093442 | A1 | 7/2002 | Gupta et al. |
| 2003/0128143 | A1 | 7/2003 | Yap et al. |
| 2003/0137359 | A1 | 7/2003 | Patana et al. |
| 2003/0174080 | A1 | 9/2003 | Brooks et al. |
| 2003/0179121 | A1 | 9/2003 | Gupta et al. |
| 2003/0227401 | A1 | 12/2003 | Yang et al. |
| 2004/0032355 | A1 | 2/2004 | Melanson et al. |
| 2004/0066321 | A1 | 4/2004 | Brooks et al. |
| 2004/0081266 | A1 | 4/2004 | Adachi et al. |
| 2004/0108947 | A1 | 6/2004 | Yang et al. |
| 2004/0228416 | A1 | 11/2004 | Anderson et al. |
| 2004/0233084 | A1 | 11/2004 | Brooks et al. |
| 2004/0233085 | A1 | 11/2004 | Fukuda et al. |
| 2004/0252038 | A1 | 12/2004 | Robinson et al. |
| 2005/0001750 | A1 | 1/2005 | Lo et al. |
| 2005/0012649 | A1 | 1/2005 | Adams et al. |
| 2005/0030212 | A1 | 2/2005 | Brooks et al. |
| 2005/0057385 | A1 | 3/2005 | Gupta et al. |
| 2005/0062627 | A1 | 3/2005 | Jelonnek et al. |
| 2005/0063505 | A1 | 3/2005 | Dubash et al. |
| 2005/0088327 | A1 | 4/2005 | Yokoyama et al. |
| 2005/0093726 | A1 | 5/2005 | Hezar et al. |
| 2005/0116850 | A1 | 6/2005 | Hezar et al. |
| 2005/0128111 | A1 | 6/2005 | Brooks et al. |
| 2005/0156767 | A1 | 7/2005 | Melanson et al. |
| 2005/0156768 | A1 | 7/2005 | Melanson et al. |
| 2005/0156771 | A1 | 7/2005 | Melanson et al. |
| 2005/0162222 | A1 | 7/2005 | Hezar et al. |
| 2005/0207480 | A1 | 9/2005 | Norsworthy et al. |
| 2005/0237119 | A1 | 10/2005 | Irie |
| 2005/0266805 | A1 | 12/2005 | Jensen et al. |
| 2005/0285685 | A1 | 12/2005 | Frey et al. |
| 2006/0028364 | A1 | 2/2006 | Rivoir et al. |
| 2006/0038708 | A1 | 2/2006 | Luh et al. |
| 2006/0044057 | A1 | 3/2006 | Hezar et al. |
| 2006/0109153 | A1 | 5/2006 | Gupta et al. |
| 2006/0115036 | A1 | 6/2006 | Adachi et al. |
| 2006/0164276 | A1 | 7/2006 | Luh et al. |
| 2006/0290549 | A1 | 12/2006 | Laroia et al. |
| 2007/0001776 | A1 | 1/2007 | Li et al. |
| 2007/0013566 | A1 | 1/2007 | Chuang et al. |
| 2007/0018866 | A1 | 1/2007 | Melanson et al. |
| 2007/0035425 | A1 | 2/2007 | Hinrichs et al. |
| 2007/0080843 | A1 | 4/2007 | Lee et al. |
| 2007/0126618 | A1 | 6/2007 | Tanaka et al. |
| 2007/0152865 | A1 | 7/2007 | Melanson et al. |
| 2007/0165708 | A1 | 7/2007 | Darabi et al. |
| 2007/0279034 | A1 | 12/2007 | Roh et al. |
| 2008/0062022 | A1 | 3/2008 | Melanson et al. |
| 2008/0062024 | A1 | 3/2008 | Maeda et al. |
| 2008/0100486 | A1 | 5/2008 | Lin et al. |
| 2008/0180166 | A1 | 7/2008 | Gustat et al. |
| 2008/0191713 | A1 | 8/2008 | Hauer et al. |
| 2008/0198050 | A1 | 8/2008 | Akizuki et al. |
| 2008/0211588 | A1 | 9/2008 | Frey et al. |
| 2008/0272945 | A1 | 11/2008 | Melanson et al. |
| 2008/0272946 | A1 | 11/2008 | Melanson et al. |
| 2009/0083567 | A1 | 3/2009 | Kim et al. |
| 2009/0096649 | A1 | 4/2009 | Ferri et al. |
| 2009/0220219 | A1 | 9/2009 | Mcleod et al. |
| 2009/0309774 | A1 | 12/2009 | Hamashita et al. |
| 2010/0020910 | A1 | 1/2010 | Bhagavatheeswaran et al. |
| 2010/0045498 | A1 | 2/2010 | Liu et al. |
| 2010/0052960 | A1 | 3/2010 | Lakdawala et al. |
| 2010/0074368 | A1 | 3/2010 | Karthaus et al. |
| 2010/0164773 | A1 | 7/2010 | Clement et al. |
| 2010/0214143 | A1 | 8/2010 | Nakamoto et al. |
| 2010/0219999 | A1 | 9/2010 | Oliaei et al. |
| 2010/0225517 | A1 | 9/2010 | Aiba et al. |
| 2010/0283648 | A1 | 11/2010 | Niwa et al. |
| 2010/0295715 | A1 | 11/2010 | Sornin et al. |
| 2011/0006936 | A1 | 1/2011 | Lin et al. |
| 2011/0050472 | A1 | 3/2011 | Melanson et al. |
| 2011/0149155 | A1 | 6/2011 | Lin et al. |
| 2011/0299642 | A1 | 12/2011 | Norsworthy et al. |
| 2012/0063519 | A1 | 3/2012 | Oliaei et al. |
| 2012/0161864 | A1 | 6/2012 | Lee et al. |
| 2012/0194369 | A1 | 8/2012 | Galton et al. |
| 2012/0200437 | A1 | 8/2012 | Moue et al. |
| 2012/0242521 | A1 | 9/2012 | Kinyua et al. |
| 2012/0275493 | A1 | 11/2012 | Fortier et al. |
| 2012/0280843 | A1 | 11/2012 | Tsai et al. |
| 2012/0286982 | A1 | 11/2012 | Kajita et al. |
| 2013/0068019 | A1 | 3/2013 | Takase et al. |
| 2013/0099949 | A1 | 4/2013 | Wagner et al. |
| 2013/0169460 | A1 | 7/2013 | Obata et al. |
| 2013/0259103 | A1 | 10/2013 | Jensen et al. |
| 2014/0028374 | A1 | 1/2014 | Zare-Hoseini et al. |
| 2014/0035769 | A1 | 2/2014 | Rajaee et al. |
| 2014/0070969 | A1 | 3/2014 | Shu |
| 2014/0113575 | A1 | 4/2014 | Mitani et al. |
| 2014/0139293 | A1 | 5/2014 | Tsangaropoulos et al. |
| 2014/0286467 | A1 | 9/2014 | Norsworthy et al. |
| 2014/0307825 | A1 | 10/2014 | Ostrovskyy et al. |
| 2014/0320325 | A1 | 10/2014 | Muthers et al. |
| 2014/0368365 | A1 | 12/2014 | Quiquempoix et al. |
| 2015/0002325 | A1 | 1/2015 | Lin |
| 2015/0009054 | A1 | 1/2015 | Ono et al. |
| 2015/0036766 | A1 | 2/2015 | Elsayed et al. |
| 2015/0061907 | A1 | 3/2015 | Miglani |
| 2015/0084797 | A1 | 3/2015 | Singh et al. |
| 2015/0109157 | A1 | 4/2015 | Caldwell et al. |
| 2015/0116138 | A1 | 4/2015 | Li et al. |
| 2015/0146773 | A1 | 5/2015 | Ma et al. |
| 2015/0171887 | A1 | 6/2015 | Okuda |
| 2015/0341159 | A1 | 11/2015 | Norsworthy et al. |
| 2015/0349794 | A1 | 12/2015 | Lin |
| 2016/0013805 | A1 | 1/2016 | Maehata |
| 2016/0049947 | A1 | 2/2016 | Adachi |
| 2016/0050382 | A1 | 2/2016 | Rizk et al. |
| 2016/0065236 | A1 | 3/2016 | Ahmed et al. |
| 2016/0127119 | A1 | 5/2016 | Anantharaman et al. |
| 2016/0149586 | A1 | 5/2016 | Roh et al. |
| 2016/0336946 | A1 | 11/2016 | Ho et al. |
| 2016/0344404 | A1 | 11/2016 | Miglani et al. |
| 2016/0359499 | A1 | 12/2016 | Bandyopadhyay |
| 2016/0373125 | A1 | 12/2016 | Pagnanelli et al. |
| 2017/0033801 | A1 | 2/2017 | Lo et al. |
| 2017/0041019 | A1 | 2/2017 | Miglani et al. |
| 2017/0045403 | A1 | 2/2017 | Zanbaghi et al. |
| 2017/0093407 | A1 | 3/2017 | Kim et al. |
| 2017/0102248 | A1 | 4/2017 | Maurer et al. |
| 2017/0134055 | A1 | 5/2017 | Ebrahimi et al. |
| 2017/0163295 | A1 | 6/2017 | Talty et al. |
| 2017/0170839 | A1 | 6/2017 | Zhao et al. |
| 2017/0170840 | A1 | 6/2017 | Zhao |
| 2017/0184645 | A1 | 6/2017 | Sawataishi |
| 2017/0222652 | A1 | 8/2017 | Adachi |
| 2017/0222658 | A1 | 8/2017 | Miglani et al. |
| 2017/0250662 | A1 | 8/2017 | Cope et al. |

(56) References Cited

U.S. PATENT DOCUMENTS

| | | | |
|---|---|---|---|
| 2017/0276484 A1 | 9/2017 | Marx et al. | |
| 2017/0288693 A1 | 10/2017 | Kumar et al. | |
| 2018/0145700 A1 | 5/2018 | Yu et al. | |
| 2019/0356329 A1 | 11/2019 | Yu et al. | |
| 2020/0106448 A1 | 4/2020 | Yu et al. | |
| 2021/0175889 A1 | 6/2021 | Yu et al. | |
| 2023/0266448 A1 | 8/2023 | Yu et al. | |

FOREIGN PATENT DOCUMENTS

| | | |
|---|---|---|
| WO | 2016063038 A1 | 4/2016 |
| WO | 2016063038 A4 | 7/2016 |
| WO | 2018094380 A1 | 5/2018 |
| WO | 2023163792 A1 | 8/2023 |

OTHER PUBLICATIONS

International Preliminary Report on Patentability for International Application PCT/US2017/062744, Report issued May 21, 2019, Mailed May 31, 2019, 8 pgs.

International Search Report and Written Opinion for International Application No. PCT/US2017/062744, Search completed Jan. 17, 2018, Mailed Feb. 5, 2018, 13 pgs.

International Search Report and Written Opinion for International Application No. PCT/US2022/070817 Search completed Apr. 13, 2022, Mailed Jun. 16, 2022, 20 pgs.

Aigner et al., "Advancement of MEMS into RF-Filter Applications", International Electron Devices Meetings, IEDM '02, Dec. 8-11, 2002, pp. 897-900, doi: 10.1109/iedm.2002.1175981.

Grudkowski et al., "Fundamental-mode VHF/UHF miniature acoustic resonators and filters on silicon", Applied Physics Letters, vol. 37, No. 11, Dec. 1, 1980, pp. 993-995, doi: 10.1063/1.91745.

Lakin et al., "Thin Film Resonators and Filters", 1982 Ultrasonics Symposium, Oct. 27-29, 1982, San Diego, CA, USA, pp. 466-475, doi: 10.1109/ultsym.1982.197870.

Lam, "A Review of the Recent Development of MEMS and Crystal Oscillators and Their Impacts on the Frequency Control Products Industry", Invited Paper, 2008 IEEE International Ultrasonics Symposium, Beijing, Nov. 2-5, 2008, pp. 694-704, doi: 10.1109/ULTSYM.2008.0167.

Majd et al., "Bandwidth Enhancement in Delta Sigma Modulator Transmitter Using Low Complexity Time-Interleaved Parallel Delta Sigma Modulator", AEU—International Journal of Electronics and Communications, vol. 69, No. 7, Apr. 11, 2015, pp. 1032-1038, doi: 10.1016/j.aeue.2015.04.001.

Piazza et al., "Piezoelectric Aluminum Nitride Vibrating Contour-Mode MEMS Resonators", Journal of Microelectromechanical Systems, vol. 15, No. 6, Dec. 2006, pp. 1406-1418, doi: 10.1109/jmems.2006.886012.

Rai et al., "A Digitally Compensated 1.5 GHz CMOS/FBAR Frequency Reference", IEEE Transactions on Ultrasonics, Ferroelectrics, and Frequency Control, vol. 57, No. 3, Mar. 4, 2010, pp. 552-561, doi: 10.1109/tuffc.2010.1447.

Ruby et al., "PCS 1900 MHz Duplexer Using Thin Film Bulk Acoustic Resonator (FBARs)", Electronics Letters, vol. 35, No. 10, May 13, 1999, pp. 794-795, doi: 10.1049/el:19990559.

Schreier et al., "Understanding delta-sigma data converters", IEEE Press, 2005, 455 pgs.

\* cited by examiner

SYSTEMS AND METHODS FOR DIGITAL SIGNAL SYNTHESIS WITH VARIABLE SAMPLE RATE DAC

CROSS REFERENCED APPLICATIONS

This application claims priority under 35 U.S.C. 119 (e) to U.S. Provisional Patent Application Ser. No. 63/268,457, entitled "Digital Signal Synthesis with DAC Sampled by Variable Frequency", filed Feb. 24, 2022 by Yu et al., which is hereby incorporated by reference in its entirety as if set forth herewith.

FIELD OF THE INVENTION

The present invention relates to digital signal synthesis with variable sample rate digital-to-analog converters (DACs).

BACKGROUND

Modern electronic systems process and store information digitally. However, due to the analog nature of the world, conversions between analog and digital domains are needed and performed by data converters. Digital-to-analog converters (DACs) can be used to convert digital codewords into analog signals (e.g., voltage, current, among others).

SUMMARY OF THE INVENTION

Systems and methods in accordance with embodiments of the invention provide for digital signal synthesis using variable sample rate DACs. One embodiment includes a digital frequency generator that includes: a direct digital frequency synthesizer (DDFS); a digital-to-analog converter (DAC); a frequency/phase estimation circuit; a stable reference clock (REF CLK); a variable frequency sample clock; a frequency control word (FCW); where the DAC is sampled by the variable frequency sample clock; where the DDFS is clocked by the variable frequency sample clock; where the frequency/phase estimation circuit receives as inputs the stable REF CLK and the variable frequency sample clock and estimates a FCW frequency error and adjusts the FCW to the DDFS; where the DDFS receives the FCW and outputs a digital sine codeword at the variable frequency sample clock to the DAC, where the FCW to the DDFS is continuously adjusted to track the variable frequency sample clock; and where the DAC converts the sine codeword to an analog waveform.

In a further embodiment, the variable frequency sample clock is at least one variable frequency sample clock selected from the group consisting of a frequency ramp generator, a pseudo random (PN) modulated frequency source, and a frequency modulation source.

In a further embodiment again, the frequency/phase estimation circuit estimates a frequency error by comparing edges of the REF CLK and the variable frequency sample clock, where the frequency error is filtered with a loop filter to generate the FCW for the DDFS.

In yet a further embodiment, the FCW is a ratio of a desired frequency (fc) and the variable frequency sample clock ($fs_j$) wherein j denotes an index of the sample frequency.

An embodiment includes a broadband modulator including: a stable symbol clock (CLK); a variable frequency sample clock; an OFDM modulator circuit that operates at the stable symbol CLK to generate OFDM symbols; a frequency/phase estimation circuit that receives as inputs the stable symbol CLK and the variable frequency sample clock and estimates a frequency error and a phase error; a variable interpolator/decimator (VID) circuit that uses the frequency error and the phase error to generate a codeword; a digital-to-analog converter (DAC) that receives the codeword from the VID and generates an analog output.

In a further embodiment, the analog output is filtered by a filter to provide a filtered analog output.

In a further embodiment, the VID circuit converts a modulated signal from the stable symbol CLK domain to the variable frequency sample clock domain, where the VID circuit generates a corrected codeword that is provided to the DAC.

DETAILED DESCRIPTION

Turning now to the drawings, systems and methods for digital signal synthesis with variable sample rate digital-to-analog converters (DACs) in accordance with various embodiments of the invention are illustrated. Systems in accordance with many embodiments can provide for digital frequency synthesis using a variable sample rate DAC. In many embodiments, a DAC can be sampled by a variable frequency source. In many embodiments, a variable frequency source can be a frequency ramp generator, pseudo random (PN) modulated frequency source, and/or frequency modulation source among others. In many embodiments, a direct digital frequency synthesizer (DDFS) can also be clocked by the same variable frequency source. In many embodiments, given that a sample frequency can be variable, a frequency control word (FCW) to the DDFS may be adjusted continuously to track the variable sample frequency. A frequency/phase estimation circuit can be used to estimate FCW frequency error. The frequency/phase estimation circuit can take both a stable reference clock and a variable sample clock as inputs. Described now are details regarding DAC operation in accordance with several embodiments of the invention.

DAC Operation

Figure 1:
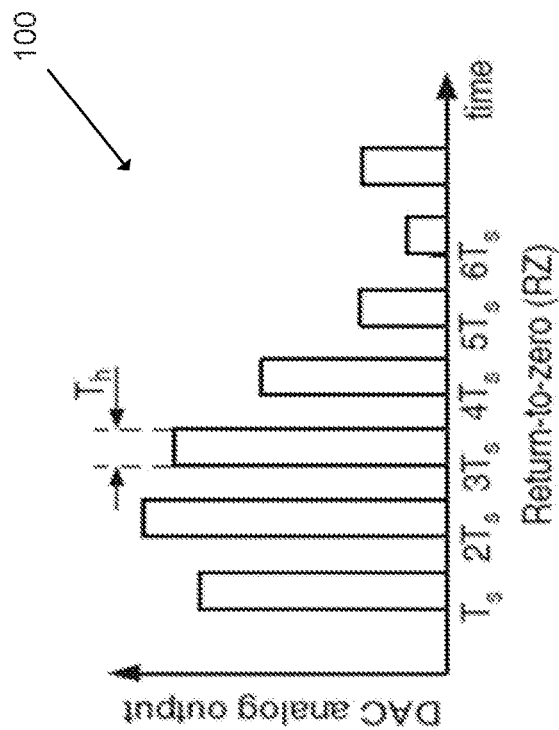
FIG. 1 illustrates DAC outputs in accordance with an embodiment of the invention.
Figure 1:
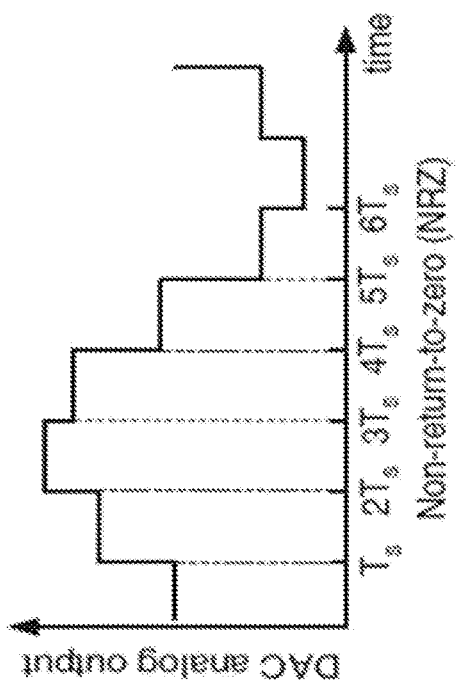
Figure 1:
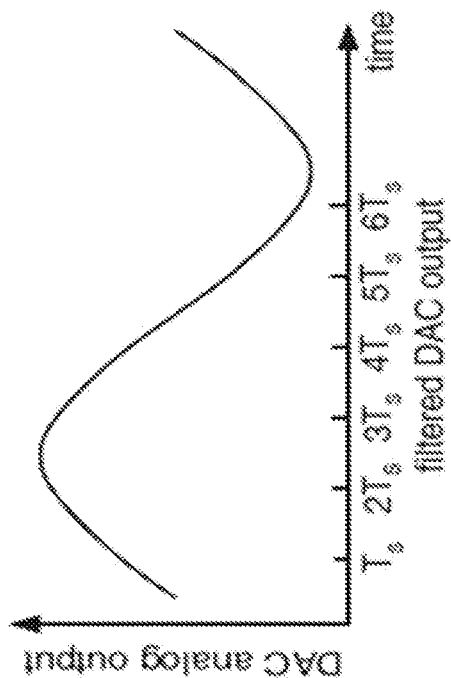

A DAC can be a device that converts a fine-precision digital-format number (typically a finite-length binary format number) to an analog electrical quantity (such a voltage, current and/or electric charge). Two basic types of DAC output formats can be used to construct an analog signal, including non-return-to-zero (NRZ) and return-to-zero (RZ). FIG. 1 illustrates DAC outputs for different types of DACs, including a DAC analog output for NRZ, a DAC analog output for RZ, and a filtered DAC output. As illustrated in FIG. 1, for NRZ, the DAC can update its analog output according to a digital input at a fixed time interval of Ts and the DAC can hold the output, where Ts can be referred to as an updating and sampling period. For an RZ type DAC, after updating the output at each time interval Ts, the DAC can hold the output for a certain time (Th), which can then go back to zero. In both types of DACs, a DAC's output can be held for a certain time Th, where 0<Th<=Ts, known as zero-order-hold. An output of a DAC is typically a stepwise or pulsed analog signal and can be low pass filtered to construct the desired analog signal.

DAC Output Spectrum

Figure 2:
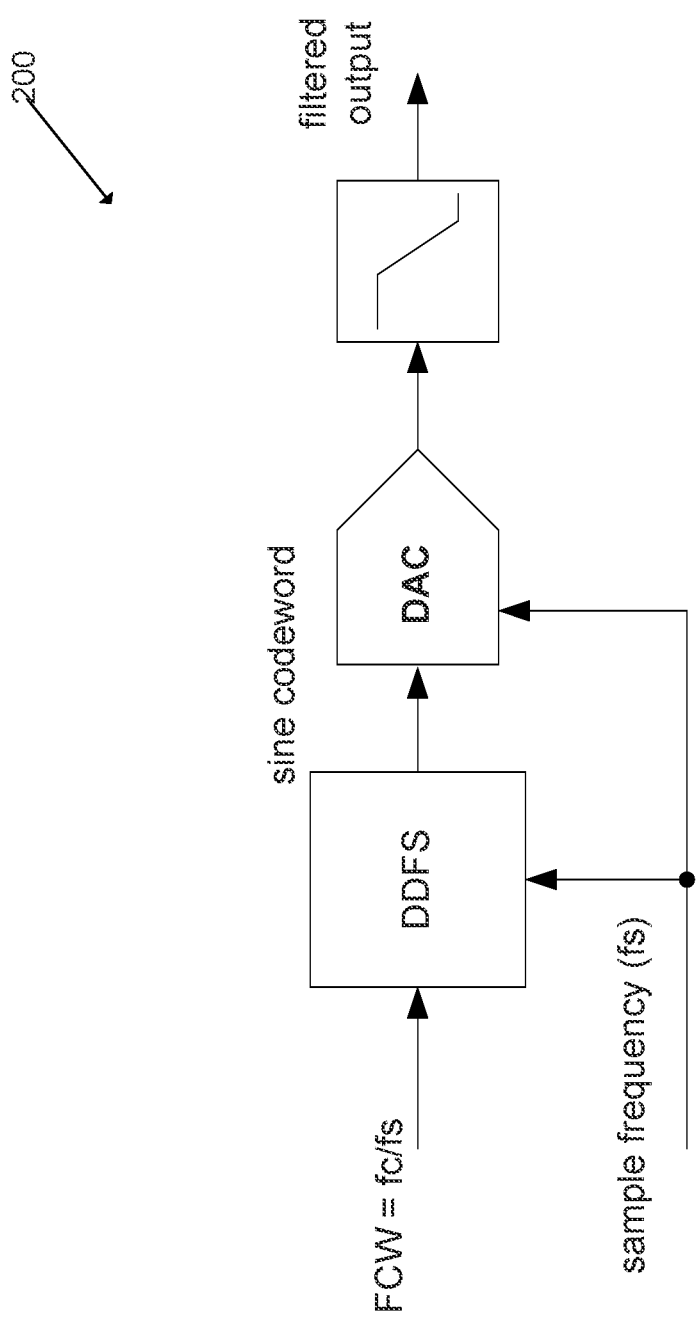
FIG. 2 illustrates an architecture for digital frequency generation in accordance with an embodiment of the invention.

An architecture of a digital frequency generator using direct digital frequency synthesis (DDFS) and a DAC in accordance with an embodiment of the invention is illustrated in FIG. 2. The DDFS input can be a frequency control word (e.g., FCW=fc/fs) which can be a ratio of a desired frequency (fc) and a sample frequency (fs). The DDFS can output a digital sine codeword at the sample rate (fs). The DAC can convert the sine codeword into an analog waveform.

Figure 3:
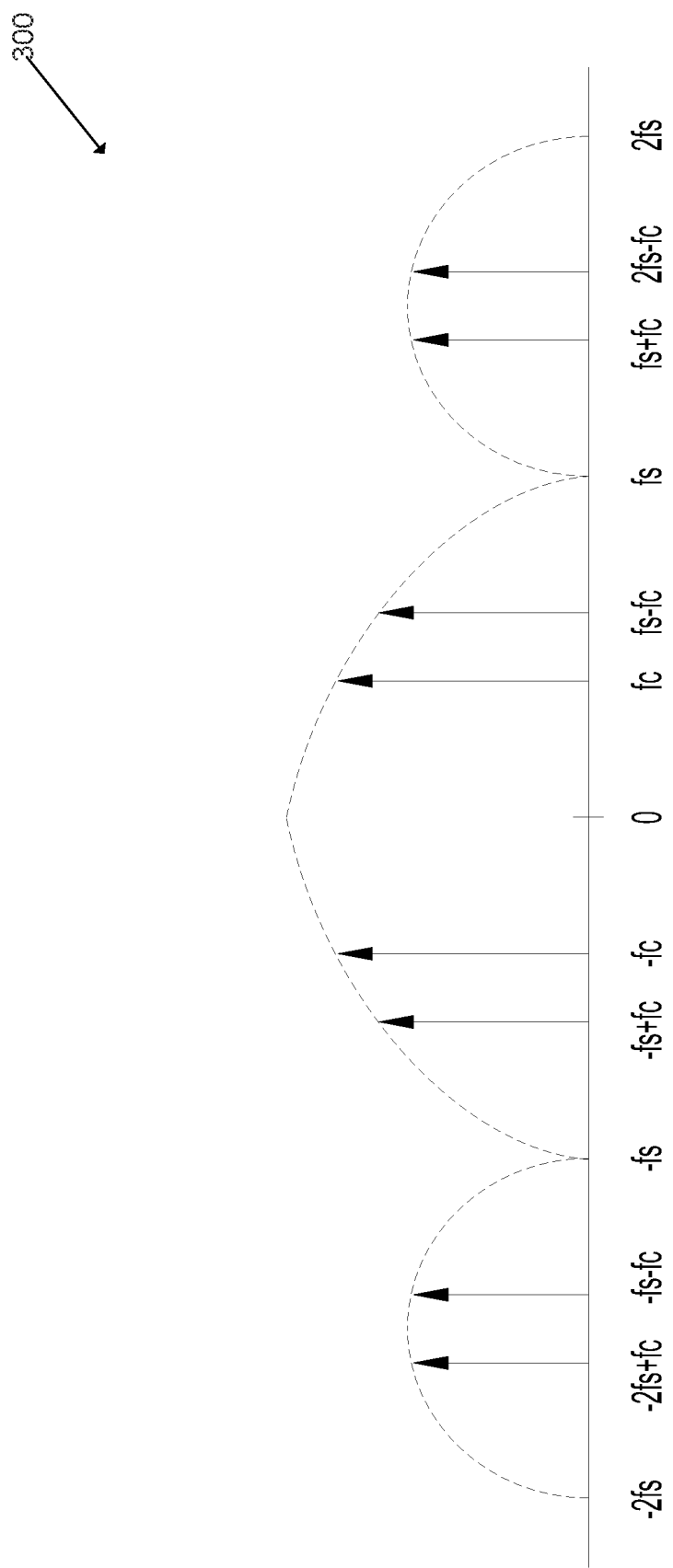
FIG. 3 illustrates NRZ DAC output spectrum in accordance with an embodiment of the invention.

A raw DAC output (e.g., NRZ and RZ) can have many harmonics other than a desired output frequency. FIG. 3 illustrates an NRZ DAC output spectrum of a single tone with frequency fc with sample frequency at fs. In addition to the desired frequency (fc and −fc), there can also be harmonic frequencies at equation (1) below:

$$n*fs+fc \text{ and } n*fs-fc \text{ where } n \text{ is an integer from } -\infty \text{ to } \infty \quad (1)$$

Figure 4:
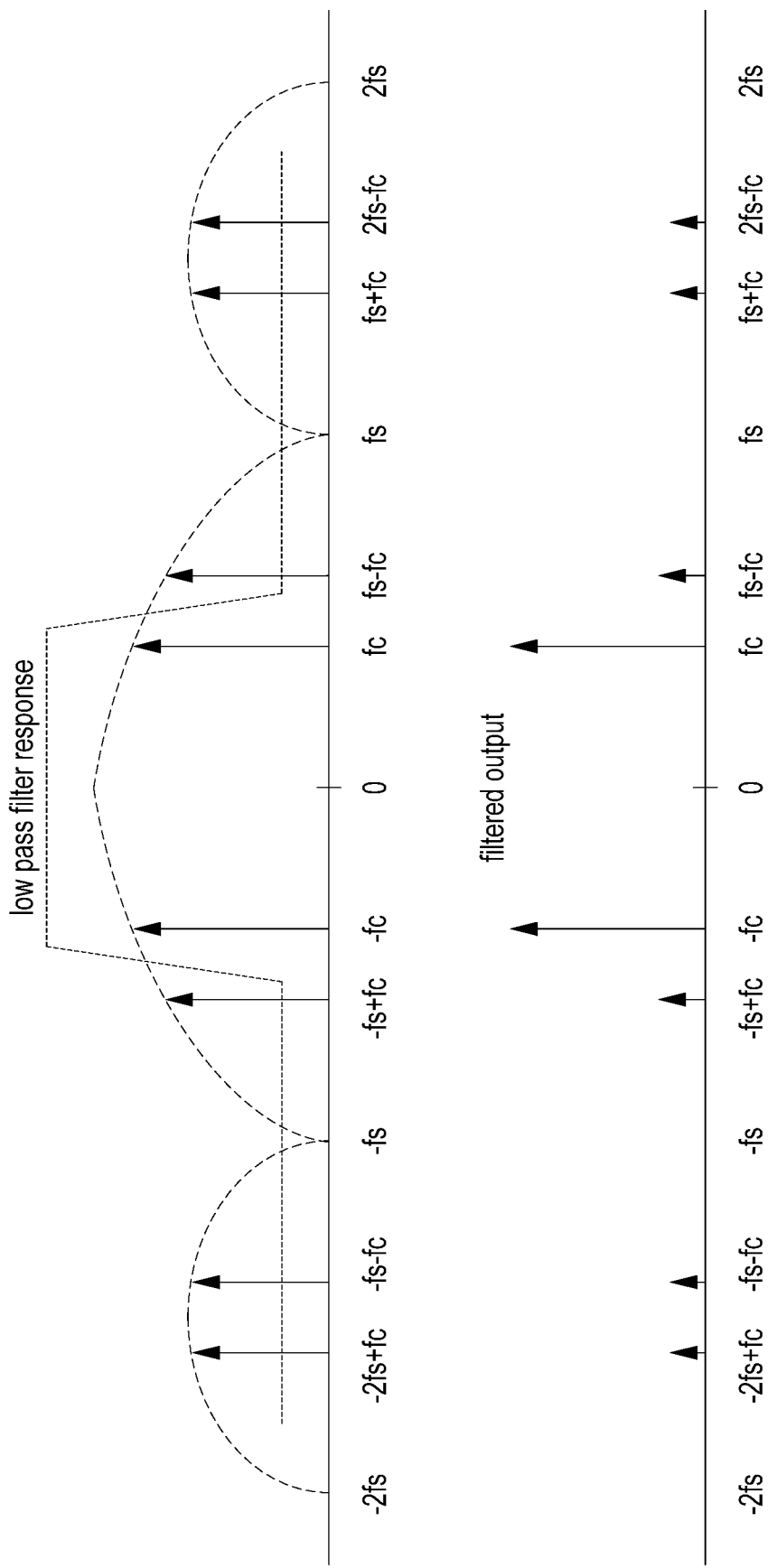
FIG. 4 illustrate a frequency spectrum filtered output in accordance with an embodiment of the invention.

These harmonics may be away from a desired frequency fc if fs is chosen properly (e.g., fc has been less than fs/2). In many embodiments, a low pass filter can be used to suppress harmonics. FIG. 4 illustrates using a low pass filter so suppress harmonics to a desired level in accordance with an embodiment of the invention.

Figure 5:
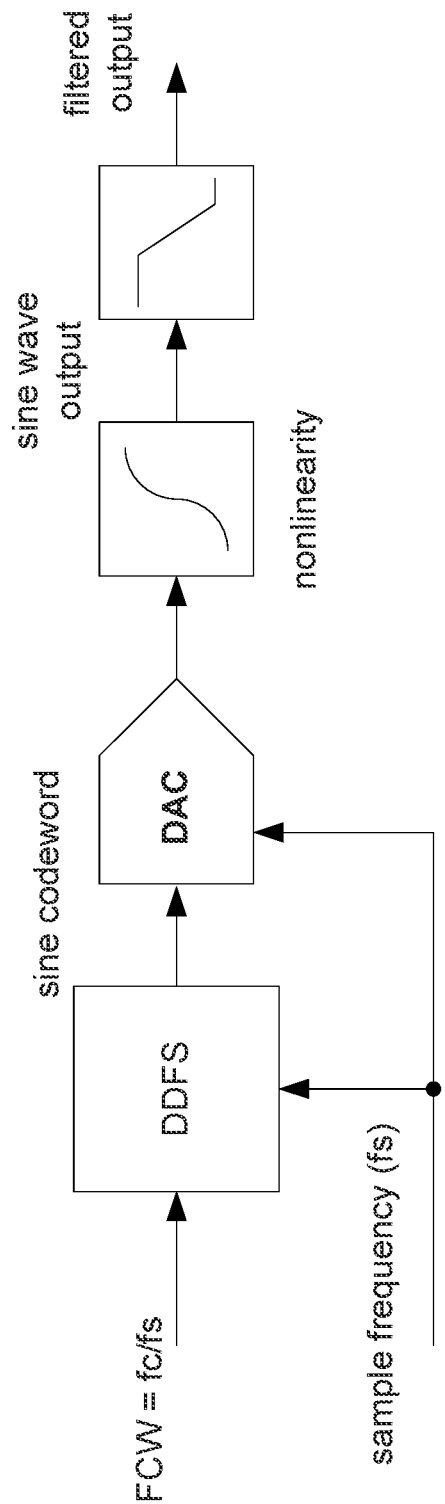
FIG. 5 illustrates a digital frequency generation architecture with DAC nonlinearity in accordance with an embodiment of the invention.
Figure 6:
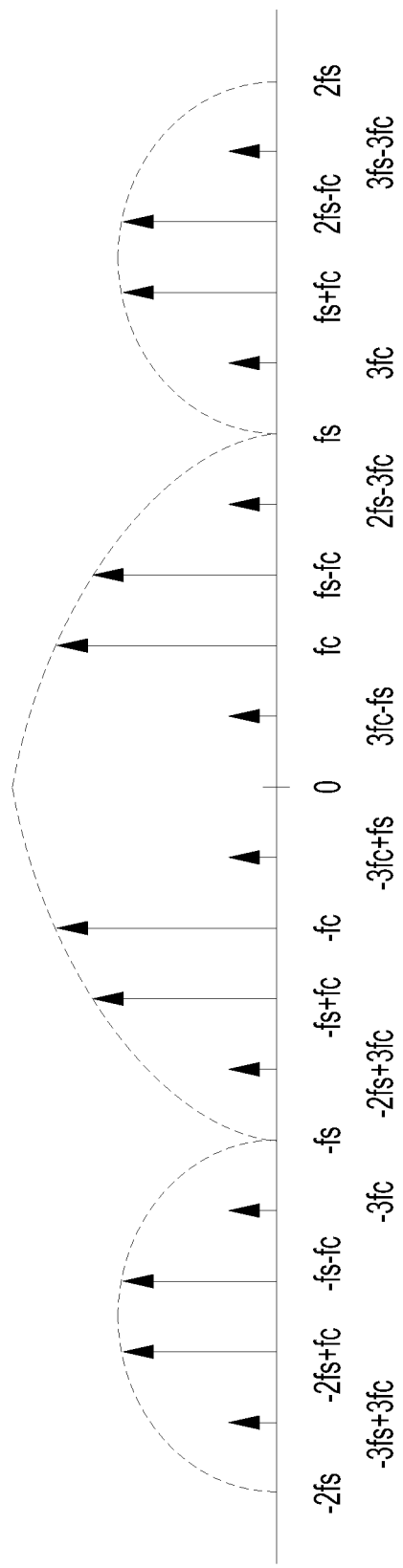
FIG. 6 illustrates an NRZ DAC output spectrum with IM products in accordance with an embodiment of the invention.
Figure 7:
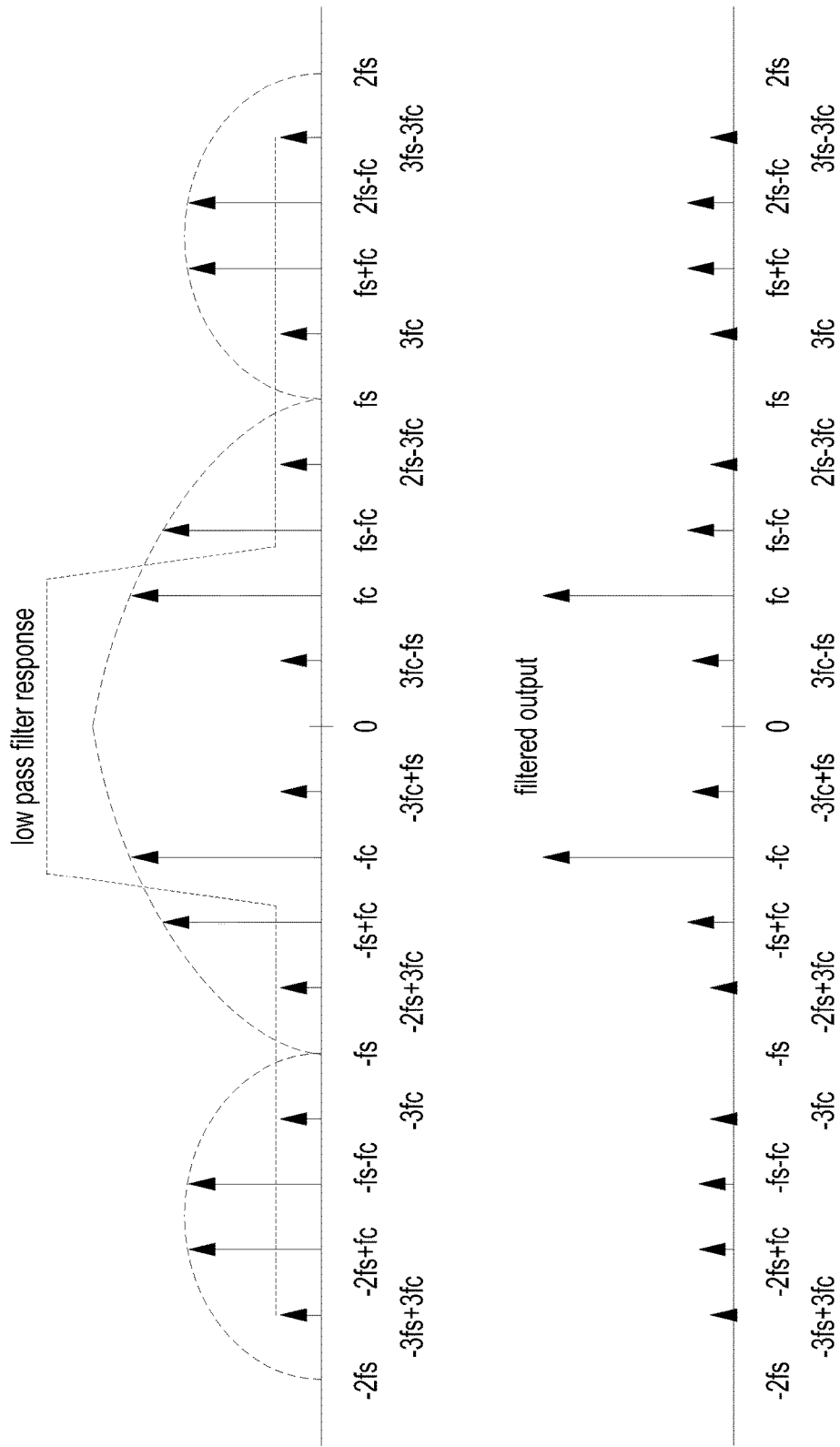
FIG. 7 illustrates a spectrum of a filtered output with IM products in accordance with an embodiment of the invention.

In many embodiments, if there is a non-linear device (e.g., an amplifier and/or driver) before the low pass filter (as shown in FIG. 5 in accordance with an embodiment), intermodulation (IM) products of these harmonics can show up in-band of fc and they may no longer be filtered out. An example of a spectrum with nonlinearity added to a DAC output in accordance with an embodiment of the invention is illustrated in FIG. 6. A spectrum of a filtered output and the in-band IM products at the filtered output in accordance with an embodiment of the invention is illustrated in FIG. 7. In many embodiments, un-filtered IM products can add noise to a system and degrade the system performance.

IM Product Suppression with Variable Sample Frequency

Systems in accordance with many embodiments can, instead of using a fixed sample frequency fs, use multiple sample frequencies fsj, where j denotes an index of the sample frequency. In many embodiments, a digital frequency control word (FCW) can be adjusted according to the sample frequency fsj, and thus a DAC output can still have a desired frequency. Accordingly, harmonics can be spread into multiple frequency components with lower power.

For example, a desired output frequency is 1000 Hz and 2 sample frequencies 5000 and 5050 can be used. For fs=5000 Hz, FCW=1000/5000=0.2 can be used and the image frequency is at 4000 Hz. For fs=5050 Hz, FCW=1000/5050=0.198 can be used and the image frequency is at 4050 Hz.

Figure 8:
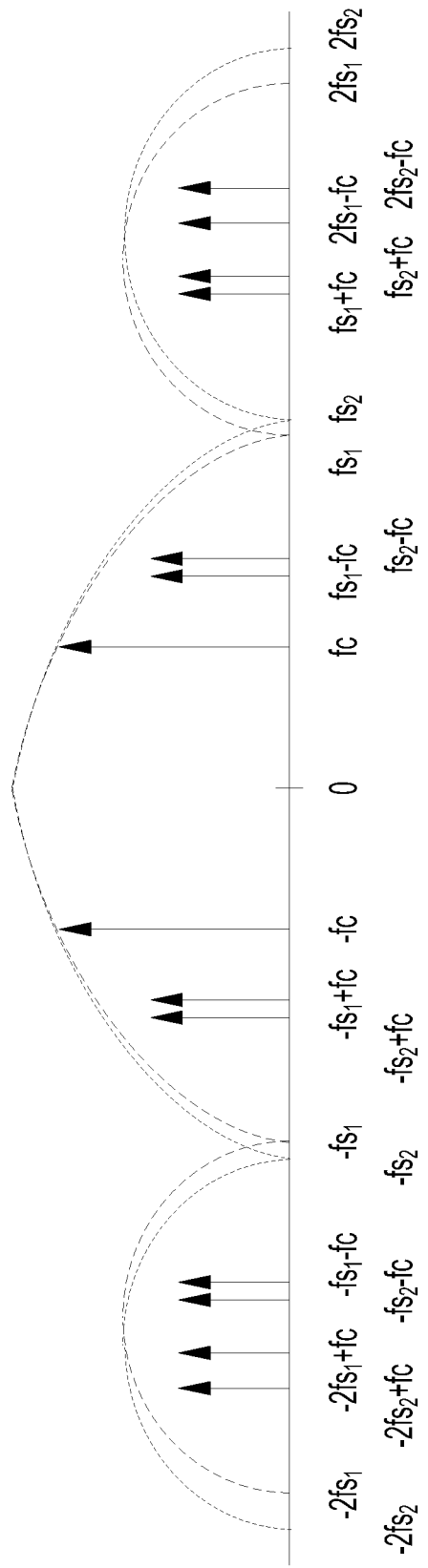
FIG. 8 illustrates an NRZ DAC output spectrum with two sample frequencies in accordance with an embodiment of the invention.

An example DAC output spectrum with 2 sample frequencies in accordance with an embodiment of the invention is illustrated in FIG. 8. As illustrated in FIG. 8, harmonics can be split into two components and their powers can be lowered by a certain amount (e.g., by 3 dB). In many embodiments, if N sample frequencies are used, a harmonic power can be lowered by 10*log 10 (N). If the sample frequency varies over a frequency band with bandwidth BW, the harmonic power in dBc/Hz can be lowered by 10*log 10 (BW).

Figure 9:
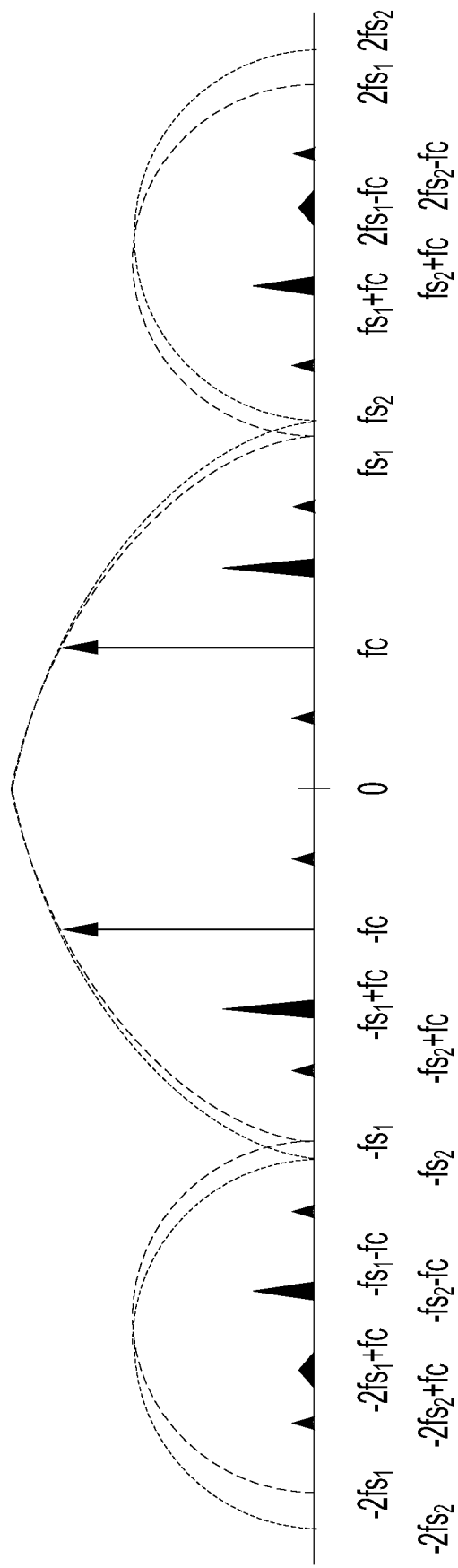
FIG. 9 illustrates an NRZ DAC output spectrum with IM products with variable sample frequency in accordance with an embodiment of the invention.

With lower harmonic power, IM products of these harmonics can be lowered with a same non-linear device. An example of variable sampled DAC output spectrum with IM products added in accordance with an embodiment of the invention is illustrated in FIG. 9. As illustrated in FIG. 9, IM products can spread over a wide frequency range and in-band SNR can be improved.

Digital Frequency Synthesis Architectures with Variable Sample Rate DACs

Figure 10:
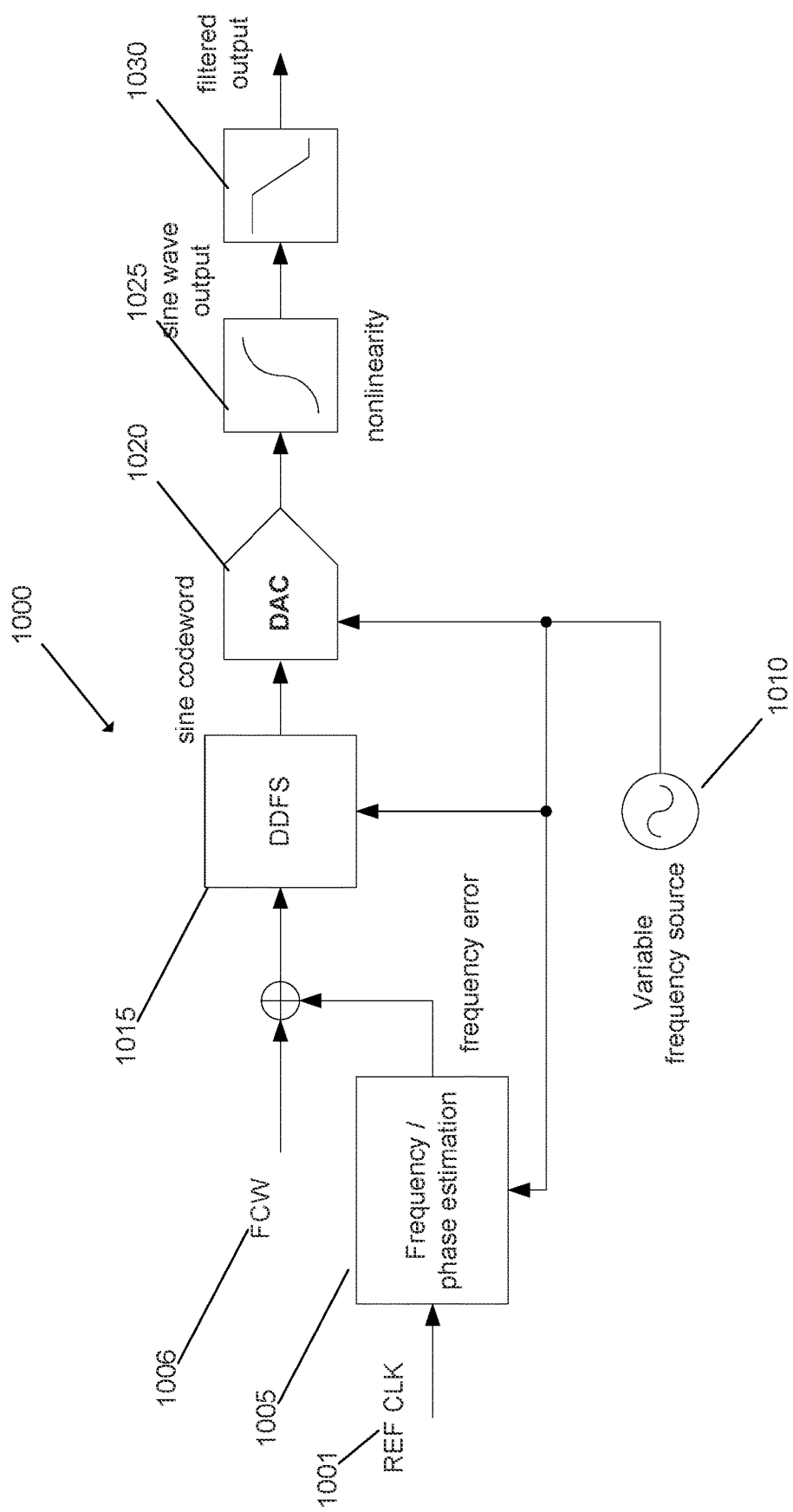
FIG. 10 illustrates an architecture for digital frequency synthesis with variable sample rate DAC in accordance with an embodiment of the invention.

A circuit architecture for digital frequency synthesis with a variable sample rate DAC in accordance with an embodiment of the invention is illustrated in FIG. 10. The DAC 1020 can be sampled by a variable frequency source 1010. In many embodiments, a variable frequency source can be a frequency ramp generator, pseudo random (PN) modulated frequency source, and/or frequency modulation source among others. In many embodiments, DDFS 1015 can also be clocked by the same variable frequency source 1010. Given the sample frequency is variable, FCW 1006 to the DDFS 1015 may need to be adjusted continuously to track the variable sample frequency. A frequency/phase estimation circuit 1005 can be used to estimate FCW frequency error. The frequency/phase estimation circuit 1005 can take both a stable reference clock 1001 and the variable sample clock 1010 as inputs. Although FIG. 10 illustrates a particular circuit architecture for digital frequency synthesis with a variable sample rate DAC, any of a variety of architectures can be utilized as appropriate to the requirements of specific applications in accordance with embodiments of the invention.

Figure 11:
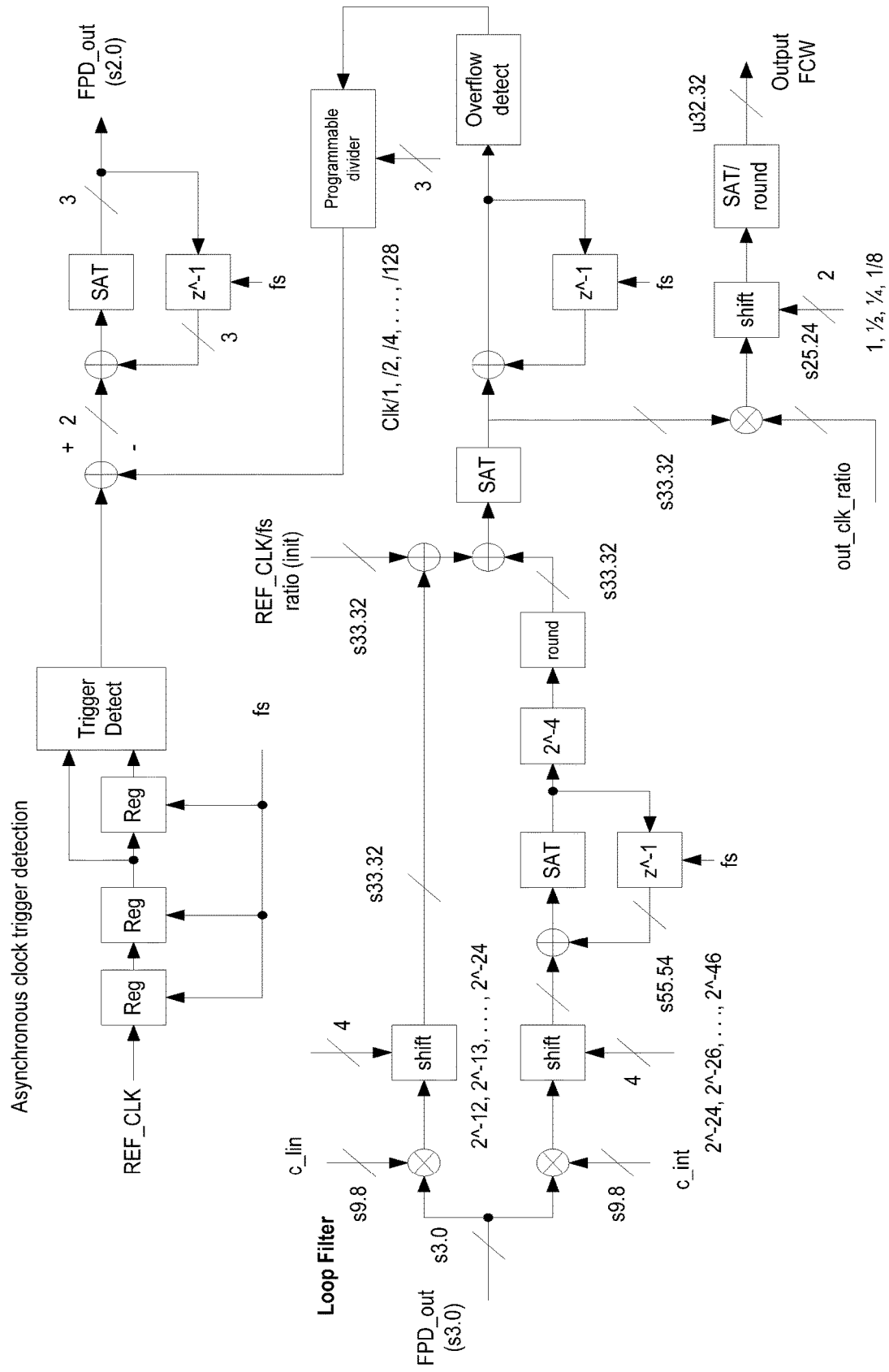
FIG. 11 illustrates an architecture for frequency/phase estimation in accordance with an embodiment of the invention.

A frequency/phase estimation circuit architecture in accordance with an embodiment of the invention is illustrated in FIG. 11. As illustrated in FIG. 11, the phase error can be estimated by comparing edges of a reference clock and a sample clock. This phase error can be filtered with a loop filter to generate a final FCW for a DDFS. Although FIG. 11 illustrates a particular circuit architecture of a frequency/phase estimation circuit, any of a variety of architectures can be utilized as appropriate to the requirements of specific applications in accordance with embodiments of the invention.

Figure 12:
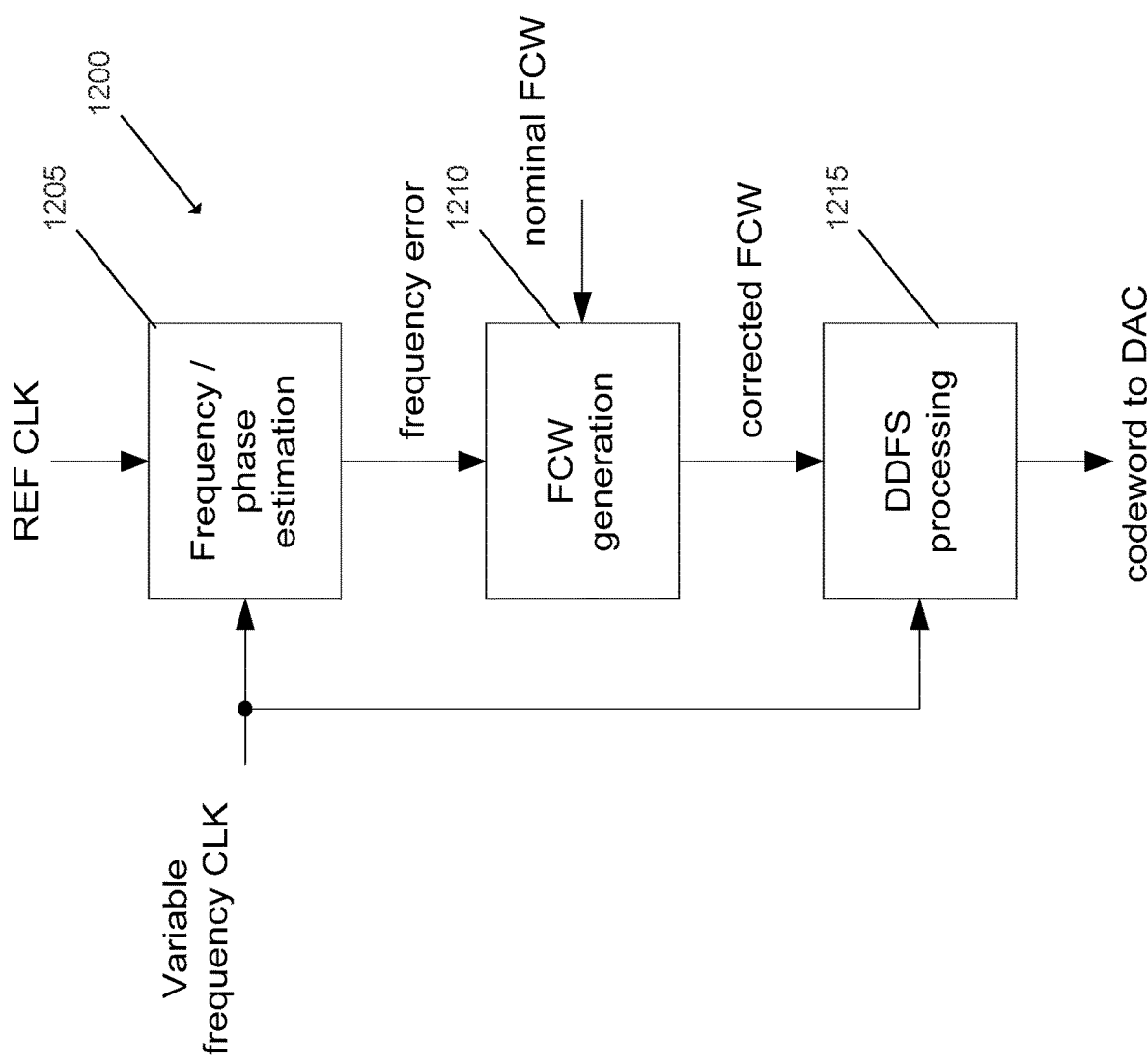
FIG. 12 illustrates a process for digital frequency synthesis with a variable sample rate DAC in accordance with an embodiment of the invention.

A process for frequency generation in accordance with an embodiment of the invention is illustrated FIG. 12. The process 1200 compares (at 1205), using a frequency/phase estimation circuit, a stable reference clock and a variable sample clock to estimate a frequency error. The process adjusts (at 1210) a frequency control word (FCW) value going to a DDFS circuit. The process generates (at 1215) a final codeword for a DAC using a DDFS circuit that takes in the corrected FCW to generate the final codeword for the DAC. The process completes. Although FIG. 12 illustrates a particular process for frequency generation using a frequency/phase estimation circuit to generate a corrected FCW, any of a variety of processes can be utilized as appropriate to the requirements of specific applications in accordance with embodiments of the invention.

Digital Broadband Modulator Architectures with Variable Sample Rate DACs

Figure 13:
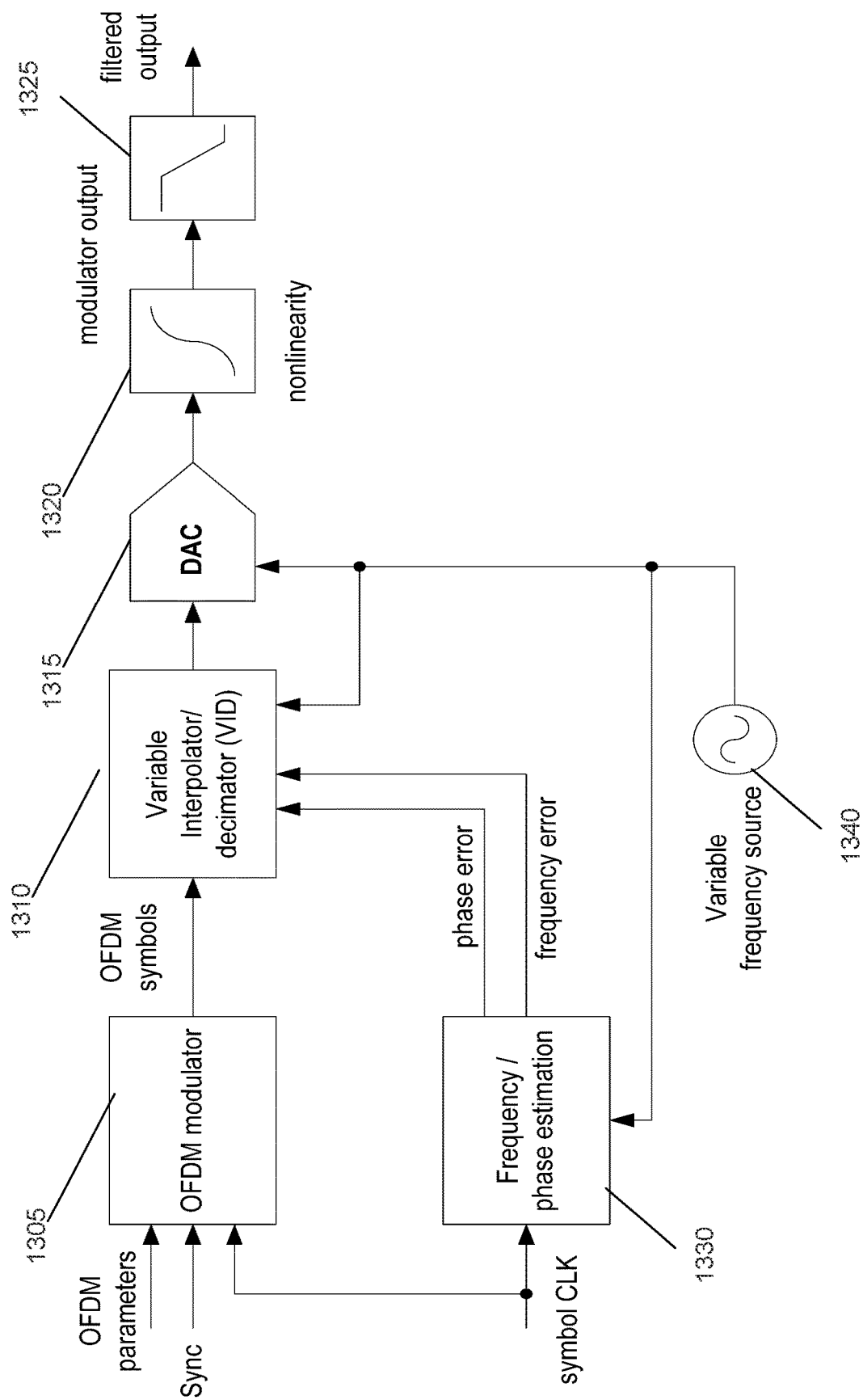
FIG. 13 illustrates a digital broadband modulator with a variable sample rate DAC in accordance with an embodiment of the invention.

Variable sample rate DAC architectures in accordance with many embodiments may not be limited to a single frequency generation. Systems in accordance with many embodiments can be used for broad-band signal generation. A circuit architecture of a broadband modulator (OFDM modulator) with a variable sample rate DAC in accordance with an embodiment of the invention is illustrated in FIG. 13. As illustrated, an OFDM modulator 1305 that can operate at a stable symbol CLK can be used to generated OFDM symbols. A frequency/phase estimation circuit 1330 can be used to estimate the frequency and phase error with symbol CLK and variable frequency sample clock. A variable-interpolator-decimator (VID) circuit can be used to convert OFDM symbols from OFDM symbol CLK domain to variable sample clock domain 1340. A variable interpolator/decimator (VID) circuit can use a frequency error and a phase error from the frequency/phase estimation circuit 1330 for the signal processing. A DAC 1315 can receive the signal from the VID and generate an output 1320, which can be filtered by a filter 1325 to provide a filtered output. Although FIG. 13 illustrates a particular variable sample rate DAC architecture, any of a variety of architectures can be utilized as appropriate to the requirements of specific applications in accordance with embodiments of the invention.

Figure 14:
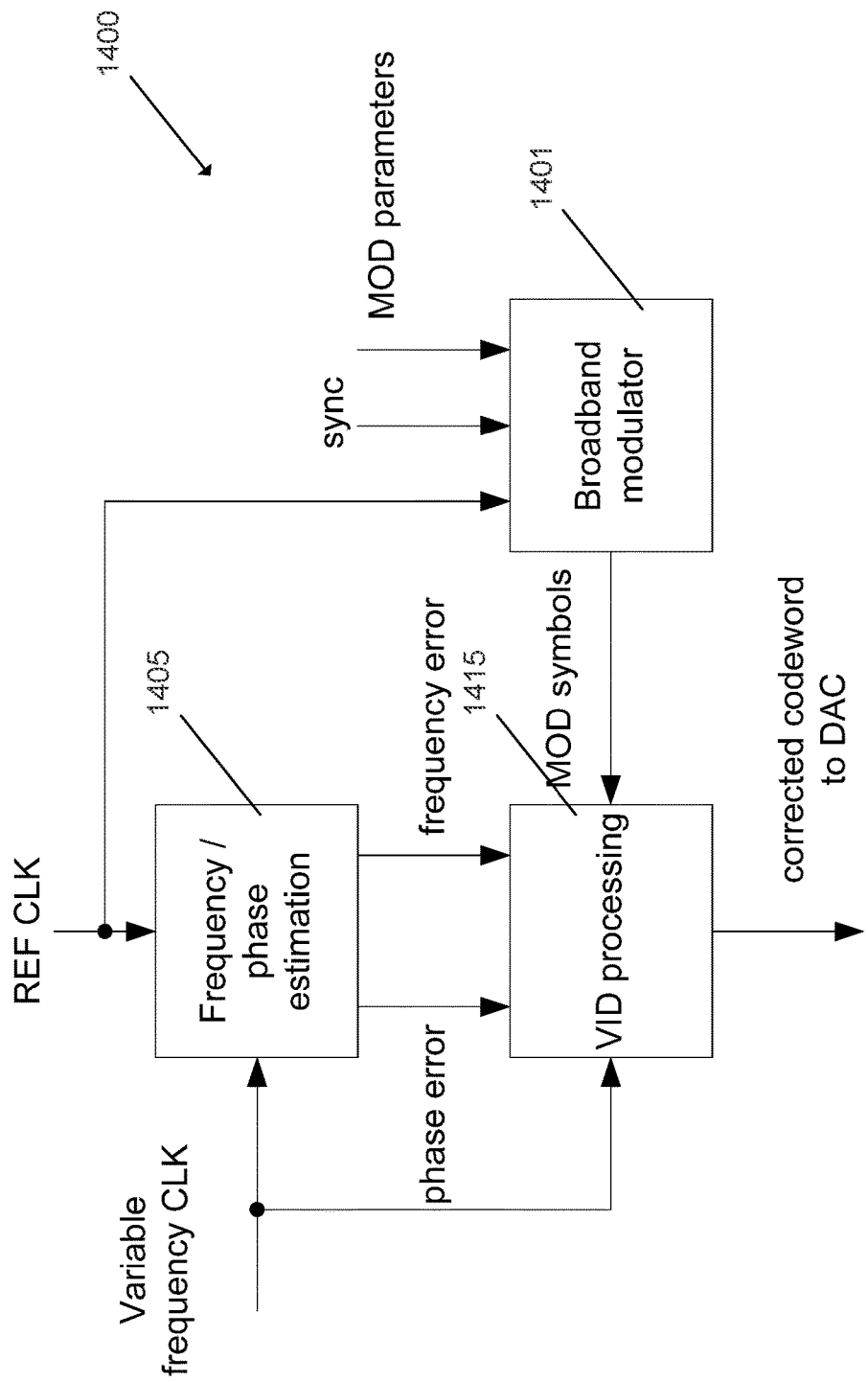
FIG. 14 illustrates a process for a broadband modulator with a variable sample rate DAC in accordance with an embodiment of the invention.

A process for broad-band signal generation in accordance with an embodiment of the invention is illustrated in FIG. 14. The process 1400 generates (at 1401) a modulated signal on a stable REF CLK using a broadband modulator circuit. In many embodiments, a broadband modulator circuit can receive a REF CLK, a sync signal, and at least one MOD parameter and the circuit can output MOD symbols. The process compares (at 1405), using a frequency/phase estimation circuit, REF CLK and a variable frequency sample clock to generate a frequency error and a phase error. The process converts (at 1415), using a VID processing circuit, the modulated signal from REF CLK domain to a variable frequency sample clock domain. The process generates, using the VID processing circuit, a corrected codeword that is provided to a DAC. The process completes. Although FIG. 14 illustrates a particular process for broad-band signal generation, any of a variety of processes can be utilized as appropriate to the requirements of specific applications in accordance with embodiments of the invention.

Mathematical Operations

A DAC operation can be modeled by 3 mathematical operations:

1) Normalized frequency scaling. A digital normalized frequency can be scaled by the actual DAC sample frequency to generate the output frequency.

2) Frequency multiplication with multiple tones. The band-limited digital signal can be mixed by multiple tones that are integer multiply of the sample frequency.

3) The broad-band signal can be convolved with a rectangular pulse. For NRZ DAC, the rectangular pulse width can be the same as the sample period. For RZ DAC, the rectangular pulse width can be less than the sample period. For both cases, this convolution can be the same as low pass filtering by a sinc( ) function in frequency domain. The frequency response of the low-pass filter can be determined by the pulse width and the sample frequency.

Given a digital signal x(n)=sin(2π·0.1*n), n=1, 2, . . . and a DAC sampled at 100 MHz can be used to convert this digital signal into analog. The output analog signal has frequencies $f_{op}$ (0.1*100=10 MHZ) and $f_{on}$ (−0.1*100=−10 MHZ) and their frequency multiplication products with integer multiples of the sample frequency 100 MHz.

$$f_{op}(k)=k*100+10 \text{ MHZ}, k=-\infty, \ldots, -1,0,1, \ldots, \infty$$

$$f_{on}(k)=k*100-10 \text{ MHz}, k=-\infty, \ldots, -1,0,1, \ldots, \infty$$

Each frequency component is weighted by the sinc( ) filter and the filter weight h(f) is given as follows:

$$h(f) = \frac{1}{T_s}\text{sinc}(f * T_p)$$

$T_p$ is the pulse width. For NRZ DAC, $T_p=T_s$. For RZ DAC, $T_p<T_s$.

Given a digital signal with normalized frequency component at $f_{nc}$ and a DAC with sample frequency at $f_s$, the DAC output can include many frequencies $f_{op}$ (k) and $f_{cn}$(k)

$$f_{cp}(k)=k*f_s+f_{nc}*f_s, k=-\infty, \ldots, -1,0,1, \ldots, \infty$$

$$f_{cn}(k)=k*f_s-f_{nc}*f_s, k=-\infty, \ldots, -1,0,1, \ldots, \infty$$

Each frequency component is weighted by $w_{cp}$(k) and $w_{cn}$(k)

$$w_{cp}(k) = \frac{1}{T_s}\text{sinc}(f_{cp}(k) * T_p)$$

$$w_{cn}(k) = \frac{1}{T_s}\text{sinc}(f_{cn}(k) * T_p)$$

For an ideal DAC with perfect linearity and $f_{nc}<0.5$, it can be shown that frequency components within $\{-f_s/2, f_s/2\}$ are $f_{cp}(0)$ and $f_{cn}(0)$. A low-pass filter with pass band $\{-f_s/2, f_s/2\}$ can filter out all other frequencies. The filtered output is a sinewave with frequency at $f_{nc}*f_s$.

However, if there is non-linearity in the DAC, intermodulation (IM) products would show up at the DAC output and these IM products can fall within $$\left\{-\frac{f_s}{2}, \frac{f_s}{2}\right\}$$

band. These in-band IM products cannot be filtered out by the low-pass filter. They become spurs and degrade quality of the generated signal. The general expression of IM products of p-th order (k-th frequency) and q-th order (l-th frequency) is as follows:

$$[f_{cp}(k)]^p*[f_{cp}(l)]^q=(k*p+l*q)f_s+(p+q)(f_{nc}*f_s)$$

$$[f_{cn}(k)]^p*[f_{cn}(l)]^q=(k*p+l*q)f_s-(p+q)(f_{nc}*f_s)$$

$$[f_{cp}(k)]^p*[f_{cn}(l)]^q=(k*p+l*q)f_s+(p-q)(f_{nc}*f_s)$$

Their associated weights are:

$$\alpha(p,q)*[w_{cp}(k)]^p*[w_{cp}(l)]^q$$

$$\alpha(p,q)*[w_{cp}(k)]^p*[w_{cn}(l)]^q$$

$$\alpha(p,q)*[w_{cn}(k)]^p*[w_{cn}(l)]^q$$

$\alpha(p, q)$ is a function associated with the DAC non-linearity.

Any IM products with non-zero (k*p+l*q) term may not be desirable since they can be spur right next to the desired frequency. On the other hand, IM products with (k*p+l*q)=0 is an integer harmonic of the desired frequency and the frequency spacing is at least $(f_{nc}*f_s)$.

Given a digital signal with $f_{nc}=0.199$ and $f_s=100$ MHZ, the desired frequency is 19.9 MHz. With k=1, p=3, l=−2, and q=1, IM products $[f_{cn}(k)]^p*[f_{cn}(l)]^q$ has output frequency at 20.4 MHz which is 0.4 MHz away from the desired frequency. This close-in spur may not be desirable and should be reduced as much as possible to improve signal quality. In many embodiments, a way to suppress this spur can be to improve the DAC linearity which means more power and area. In certain embodiments, another way can be to sample the DAC with variable sample frequency $f_s(t)$. $f_s(t)$ can be a random variable that takes value between $\{f_{s\_min}, f_{s\_max}\}$. If the difference between $f_{s\_min}$ and $f_{s\_max}$ is small compared to $$f_{s\_min}\left(\frac{f_{s\_max}-f_{s\_min}}{f_{s\_min}}\ll 1\right),$$

can the above DAC analysis can extend from fixed frequency sampling to variable frequency sampling.

Given a digital signal with normalized frequency component at $f_{nc}$ (t) and a DAC with variable sample frequency at $f_s(t)$, $f_{nc}$ (t) tracks the change of $f_s(t)$ such that $f_{nc}(t)*f_s(t)=fc$. The DAC output can include many frequencies $f_{cp}(k, t)$ and $f_{cn}(k, t)$ $$f_{cp}(k,t)=k*f_s(t)+f_c, k=-\infty,\ldots,-1,0,1,\ldots,\infty$$

$$f_{cn}(k,t)=k*f_s(t)-f_c, k=-\infty,\ldots,-1,0,1,\ldots,\infty$$

Each frequency component is weighted by $w_{cp}(k, t)$ and $w_{cn}(k, t)$ $$w_{cp}(k, t) = \frac{1}{T_s}\text{sinc}(f_{cp}(k, t)*T_p(t))$$

$$w_{cn}(k, t) = \frac{1}{T_s}\text{sinc}(f_{cn}(k, t)*T_p(t))$$

Added non-linearity, IM products of p-th order (k-th frequency) and q-th order (l-th frequency) is as follows:

$$[f_{cp}(k,t)]^p*[f_{cp}(l,t)]^q=(k*p+l*q)f_s(t)+(p+q)f_c$$

$$[f_{cn}(k,t)]^p*[f_{cn}(l,t)]^q=(k*p+l*q)f_s(t)-(p+q)f_c$$

$$[f_{cp}(k,t)]^p*[f_{cn}(l,t)]^q=(k*p+l*q)f_s(t)+(p-q)f_c$$

Their associated weights are:

$$\alpha(p,q)*[w_{cp}(k,t)]^p+[w_{cp}(l,t)]^q$$

$$\alpha(p,q)*[w_{cp}(k,t)]^p+[w_{cn}(l,t)]^q$$

$$\alpha(p,q)*[w_{cn}(k,t)]^p*[w_{cn}(l,t)]^q$$

Note that any IM products with non-zero (k*p+l*q) term is no longer a single tone. Its frequency spreads over a wide range depending on $\{f_{s\_min}, f_{s\_max}\}$, k, p, l, and q.

To generate a frequency with 19.9 MHz with a variable sample frequency $f_s(t)$ and $\{f_{s\_min}=99.9$ MHZ, $f_{s\_max}=100.1$ MHz$\}$, the normalized frequency $f_{nc}$ (t) should be between 0.1988 and 0.1992 tracking $f_s(t)$. With k=1, p=3, l=−2, and q=1, IM products $[f_{cn}(k)]^p*[f_{cn}(l)]^q$ has output frequencies range from 19.9 to 20.9 MHz. Since the IM product is spread over a wide range (1 MHZ), each individual tone in the frequency range is reduced (1/1,000,000 in this case).

While the above descriptions and associated figures have digital signal synthesis with variable sample rate digital-to-analog converters, it should be clear that any of a variety of configurations for digital signal synthesis with variable sample rate digital-to-analog converters can be implemented in accordance with embodiments of the invention. More generally, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A digital frequency generator comprising:
   a direct digital frequency synthesizer (DDFS);
   a digital-to-analog converter (DAC);
   a frequency/phase estimation circuit;
   a stable reference clock (REF CLK);
   a variable frequency sample clock; and
   a frequency control word (FCW);
   wherein the DAC is sampled by the variable frequency sample clock;
   wherein the DDFS is clocked by the variable frequency sample clock;
   wherein the frequency/phase estimation circuit receives as inputs the stable REF CLK and the variable frequency sample clock and estimates a FCW frequency error and adjusts the FCW to the DDFS;
   wherein the DDFS receives the FCW and outputs a digital sine codeword at the variable frequency sample clock to the DAC, wherein the FCW to the DDFS is continuously adjusted to track the variable frequency sample clock; and
   wherein the DAC converts the digital sine codeword to an analog waveform.

2. The digital frequency generator of claim 1, wherein the variable frequency sample clock is at least one variable frequency sample clock selected from the group consisting of a frequency ramp generator, a pseudo random (PN) modulated frequency source, and a frequency modulation source.

3. The digital frequency generator of claim 1, wherein the frequency/phase estimation circuit estimates a frequency error by comparing edges of the REF CLK and the variable frequency sample clock, wherein the frequency error is filtered with a loop filter to generate the FCW for the DDFS.

4. The digital frequency generator of claim 1, wherein the FCW is a ratio of a desired frequency (fc) and the variable frequency sample clock ($fs_j$) wherein j denotes an index of the sample frequency.

5. A broadband modulator comprising:
- a stable symbol clock (CLK);
- a variable frequency sample clock;
- an OFDM modulator circuit that operates at the stable symbol CLK to generate OFDM symbols;
- a frequency/phase estimation circuit that receives as inputs the stable symbol CLK and the variable frequency sample clock and estimates a frequency error and a phase error;
- a variable interpolator/decimator (VID) circuit that uses the frequency error and the phase error to generate a codeword; and
- a digital-to-analog converter (DAC) that receives the codeword from the VID and generates an analog output.

6. The broadband modulator of claim 5, wherein the analog output is filtered by a filter to provide a filtered analog output.

7. The broadband modulator of claim 5, wherein the VID circuit converts a modulated signal from the stable symbol CLK domain to the variable frequency sample clock domain, wherein the VID circuit generates a corrected codeword that is provided to the DAC.

\* \* \* \* \*